United States Patent [19]

Kida et al.

[11] Patent Number: 4,830,691
[45] Date of Patent: May 16, 1989

[54] PROCESS FOR PRODUCING HIGH-DENSITY WIRING BOARD

[75] Inventors: Akinari Kida, Shimodate; Naoki Fukutomi, Yuki; Yoshiaki Tsubomatsu; Takuya Yasuoka, both of Shimodate, all of Japan

[73] Assignee: Hitachi Chemical Company, Ltd., Tokyo, Japan

[21] Appl. No.: 32,249

[22] Filed: Mar. 31, 1987

[30] Foreign Application Priority Data

Mar. 31, 1986 [JP] Japan .................. 61-73842

[51] Int. Cl.$^4$ .................. B44C 1/22; C03C 15/00; C03C 25/06; C23F 1/02
[52] U.S. Cl. .................. 156/631; 29/846; 29/852; 156/634; 156/655; 156/659.1; 156/668; 156/150; 156/233; 156/901; 156/902; 427/97; 430/317; 430/318

[58] Field of Search .............. 156/629, 630, 631, 634, 156/655, 656, 659.1, 668, 901, 902, 150, 151, 233; 29/846, 852; 430/313, 314, 315, 317, 318; 427/96–98; 174/68.5; 361/397, 398

[56] References Cited

U.S. PATENT DOCUMENTS

| | | | |
|---|---|---|---|
| 4,180,608 | 12/1979 | Del .................. | 29/846 X |
| 4,306,925 | 12/1981 | Lebow et al. .................. | 156/150 |
| 4,566,186 | 1/1986 | Bauer et al. .................. | 29/852 |
| 4,604,160 | 8/1986 | Murakami et al. .................. | 156/630 |
| 4,606,787 | 8/1986 | Pelligrino .................. | 156/150 X |
| 4,668,332 | 5/1987 | Ohnuki et al. .................. | 156/630 |

*Primary Examiner*—William A. Powell
*Attorney, Agent, or Firm*—Antonelli, Terry & Wands

[57] ABSTRACT

A wiring board comprising (A) a base substrate on which the necessary wiring pattern has already been formed, and (B) a multi-layer substrate bonded to the wiring pattern side of said base substrate (A) and comprising heat-resistant resin layers and thin-film wiring patterns formed by a thin film forming method under vacuum can mount LSI chips on the substrate and realize increased density of signal wiring.

17 Claims, 2 Drawing Sheets

F I G. 7
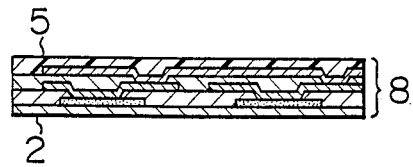
F I G. 8
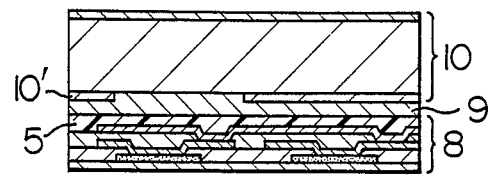
F I G. 9
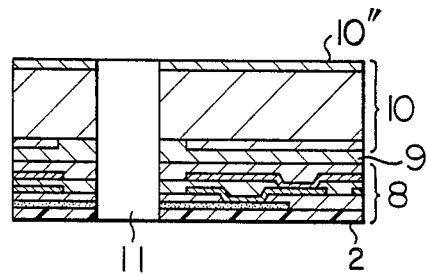
F I G. 10
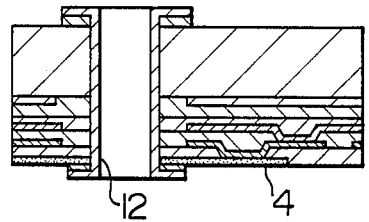

PROCESS FOR PRODUCING HIGH-DENSITY WIRING BOARD

BACKGROUND OF THE INVENTION

This invention relates to a wiring board, particularly a high-density wiring board suited for the realization of "chip-on-board" technology, and a process for producing the same.

The high-degree integration of LSI chips and speed-up of operation has intensified the necessity of higher wiring density, lower dielectric constant, etc., on the part of wiring board. Especially, request is keen recently for the fruition of chip-on-board system in which the bare chips are mounted directly on a substrate for reducing the chip-to-chip wiring length. For the production of wiring boards adaptable to such chip-on-board system by using an uncostly and mass-produceable plastic insulating substrate, researches have been made on the method in which, for enabling higher density of signal wiring and high-speed operation, the insulating layers made of a polyimide resin and the copper-based thin-film wiring layers formed by vacuum deposition or other techniques are built up successively on the wiring pattern side of a single-side copper-clad laminate on which the necessary wiring pattern including power source, grounding layer, etc., has already been formed on one side thereof.

However, the following problem was involved in forming said thin-film wiring layer on the copper-clad laminate.

In case of using a glass cloth-epoxy laminate or glass cloth-polyimide laminate which are the typical examples of copper-clad laminates, since water is adsorbed on the glass cloth, such water would be gasified in treatment under vacuum (reduced pressure) which is required for vacuum deposition or sputtering, causing exfoliation at the interface between the glass cloth and the resin. It was therefore difficult to form a thin-film wiring pattern on a practical copper-clad laminate by a vacuum process.

SUMMARY OF THE INVENTION

Accordingly, the present invention has for its object to provide a high-density wiring board which enables direct mounting of LSI chips on a substrate, can realize increased density of signal wiring and speed-up of operation, further enables use of a copper-clad laminate as base substrate, and is therefore uncostly and capable of mass production, and a process for producing such high-density wiring board.

In accordance with this invention, there is provided a high-density wiring board comprising (A) a base substrate on which the necessary wiring pattern has already been formed, and (B) a multi-layer substrate bonded on the wiring pattern side of said base substrate (A) and comprising the heat-resistant resin layers and the thin-film wiring patterns formed by a thin film forming method under vacuum, said resin layers and thin-film wiring patterns being successively built up in a desired number of layers.

The present invention further provides a process for producing said high-density wiring board comprising the following steps:

(a) forming a metal layer on a tentative substrate;
(b) forming a predetermined resist pattern on said metal layer;
(c) forming on said metal layer a surface wiring pattern of a metal which is resistant to the etching solution used for etching the metal layer;
(d) removing the resist pattern;
(e) forming on said surface wiring pattern the heat-resistant resin layers and the thin-film wiring patterns formed by an in-vacuo thin film forming method, said resin layers and thin-film wiring patterns being successively built up in a desired number of layers to form a multi-layer substrate;
(f) integrally laminating other wiring board substrate, on which the necessary wiring pattern has already been formed, on the the-resistant resin layer side of said multi-layer substrate after said tentative substrate has been separated, or integrally laminating said other wiring board substrate on the heat-resistant resin layer side of said multi-layer substrate and then separating said tentative substrate; and
(g) conducting the necessary circuit forming works including removal of the metal layer.

BRIEF DESCRIPTION OF THE DRAWINGS

FIGS. 1 to 10 are cross-sectional views showing production steps of the printed circuit wiring board according to this invention.

DESCRIPTION OF THE PREFERRED EMBODIMENTS

Figure 1:
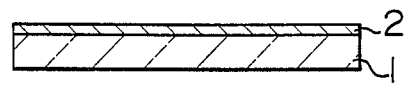

The present invention will be explained in detail below referring to the drawings, wherein the following nomenclature is used throughout:

| | |
|---|---|
| 1: tentative substrate | 2: copper layer |
| 3: resist pattern | 4: surface wiring pattern |
| 5: polyimide layer | 6: viahole |
| 7: thin-film wiring pattern | 8: single-side copper-foiled polyimide multi-layer substrate |
| 9: prepreg | 10: copper-clad laminate on which circuits have already been formed |
| 11: through-hole | 12: through-hole plating copper |

Figure 2:
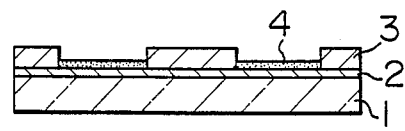
Figure 3:
Figure 4:
Figure 5:
Figure 6:
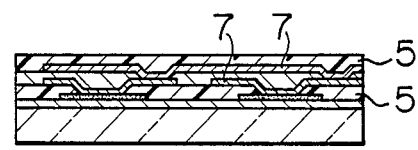

As illustrated in FIG. 1, a copper layer 2 is formed on a tentative substrate 1 by suitable means such as electroplating, electroless plating, resistance heating under vacuum, electron beam deposition, sputtering, or a combination thereof. Copper may be substituted with other metals such as aluminum, nickel or the like. The tentative substrate 1 is made or iron, a ferroalloy, aluminum, an aluminum alloy, ceramic or other like material. Then a resist layer is formed on the surface of said copper layer 2 by laminating a photosensitive resist film on said copper layer surface or by coating said copper layer surface with a liquid photosensitive resist and then drying it, or by other suitable method, and the thus formed resist layer is exposed and developed to form a resist pattern such as shown by 3 in FIG. 2. This resist pattern is then subjected to gold plating resistant to etchant used for etching the copper layer 2 to form a wiring pattern 4 which serves as the surface pattern in the finished laminate. In this step, nickel plating may be applied on said gold plating, or copper plating may be further applied after nickel plating on said gold plating. Plating of said metals can be accomplished either by electroplating or by electroless plating. Even in case of using aluminum, nickel or other metal in place of copper of the copper layer 2, any metal which is resistant to the etching solution used etching said metal layer can be used for the surface wiring pattern 4. After removing the resist pattern 3, a heat-resistant resin layer such as a polyimide layer is formed over the whole surface of the copper layer as shown by 5 in FIG. 3 by, for instance, applying a liquid polyimide resin and then curing it or by laminating a B-stage polyimide film and then curing it. Then viaholes are formed in said resin (polyimide) layer as shown by 6 in FIG. 4 by, for instance, wet etching said resin layer after forming a resist pattern (not shown) at the desired part or by plasma etching or sputter etching said layer after forming a resist pattern (not shown), or by a method using laser. Then a thin-film wiring pattern is formed as shown by 7 in FIG. 5. The following methods are available for forming this thin-film wiring pattern: (1) a wiring metal is deposited on the polyimide layer surface and in the inside of viaholes by electron beam deposition, sputtering or other method and then the unnecessary metal is etched away with a resist pattern provided at the parts which serve as wiring; (2) a wiring metal is deposited on the polyimide layer surface and in the inside of viaholes by electron beam deposition, sputtering or other method, then the wiring metal is further built up by electroless plating or electroplating with a resist pattern provided at the parts which don't serve as wiring, and then after removing the resist, the metal at the unnecessary parts is etched away; (3) a wiring metal is deposited on the polyimide layer surface by electron beam deposition, sputtering or other method with a resist pattern provided at the parts which don't serve as wiring, and then the resist is separated to thereby simultaneously remove the wiring metal at the unnecessary parts (lift-off method). Copper is most preferred as the wiring metal to be used for said thin film formation under vacuum, but it may be used in combination with chromium, nickel, gold or other like metal. Thereafter, the steps of FIGS. 3 to 5 are repeated a desired number of times to form a multilayered structure shown in FIG. 6, and then the tentative substrate 1 is mechanically separated to obtain a polyimide multi-layer substrate 8 having a copper layer on one side shown in FIG. 7. Such single-side copper-layered polyimide multi-layer substrate 8 may be formed on both sides of the tentative substrate 1 simultaneously.

Formation of the multi-layer structure comprising a laminate of polyimide resin layers and thin-film wiring patterns may be accomplished by a method in which after forming the polyimide layer, its surface is mechanically, physically and/or chemically removed and flattened so that the pattern is exposed, then a desired thin-film wiring pattern is formed on this surface and the steps of forming polyimide layers, removing and flattening the polyimide layer surface and forming a thin-film wiring pattern are repeated a desired number of times, after which the tentative substrate is removed.

Then said single-side copper-layered polyimide multi-layer substrate 8 is combined with a single-side copper-clad laminate 10 on which the necessary pattern 10' including power source, grounding layer, etc., has already been formed on one side, with a prepreg 9 placed therebetween so that the polyimide layer 5 of said polyimide multi-layer substrate 8 will face the wiring pattern 10' side of said single-side copper-clad laminate 10, and then the whole assembly is pressed under heating to obtain an integral laminated structure. As for circuitries on the copper-clad laminate 10, it is necessary that at least those on the side contacting the polyimide multi-layer substrate 8 be formed beforehand. As the prepreg 9, it is possible to use one which has been prepared by impregnating a glass cloth, Kepler's cloth or quartz cloth with a polyester resin, epoxy resin or polyimide resin and curing it to the state of B-stage.

As the copper-clad laminate 10 on which the circuits have already been formed, there can be used the laminates using said materials of prepreg 9, namely organic insulating laminates, and the copper-clad laminates having metal core at the center. As the metal therefor, copper, aluminum, nickel-iron alloy and the like can be used. It is also possible to use inorganic laminates such as ceramic laminates, enamel laminates, etc.

Separation of the tentative substrate 1 may be conducted after integral lamination of the polyimide multi-layer substrate 8 and the copper-clad laminate 10. Then through-holes 11 are formed at the necessary parts of the integral laminate by drilling or other means as shown in FIG. 9, and the copper plating is applied in the inside of these through-holes or both in the inside of said through-holes and on the surface of the integral laminate by electroless plating or by a combination of electroless plating and electroplating. Then, after forming a resist pattern at the necessary parts of the laminate surface and the through-holes, copper at the unnecessary parts of the copper foil 10" on one side of the copper-clad laminate 10 and of the copper layer 5 of the polyimide multi-layer substrate 8 is removed by etching (tenting method) to obtain a printed wiring board shown in FIG. 10. A conventional method can be used for such circuit formation. When etching is conducted on the copper layer 5 of the polyimide multi-layer substrate 8, such etching is checked by the surface wiring pattern 4 as it is made of gold. This gold pattern (surface wiring pattern 4) is formed in a state of being embedded in the structure.

According to the present invention, it is possible to form a thin-film wiring pattern free from the problem of gas release since the materials used in the vacuum process are a metal, a ceramic material and a heat-resistant resin alone. After separating the tentative substrate, the obtained multi-layer substrate is integrally laminated with other wiring board substrate which has the problem of gas release, and the integral laminate is then simply subjected to the necessary workings such as drilling of through-holes, copper plating of the through-holes by electroless and/or electroplating, wet etching, etc., which are normally carried out in the ordinary process for producing printed wiring boards by working copper-clad laminates. Thus, in accordance with this invention, there can be easily produced a high-density printed wiring board available for chip-on-board practice.

The process for producing wiring boards according to this invention has the following prominent effects.

(1) A thin-film wiring pattern can be formed only with the materials having no possibility of causing gas release, and by laminating a multi-layer substrate having such wiring pattern with a base structure made by working a copper-clad laminate which has difficulties in forming a thin-film wiring pattern, it is possible to produce a high-density printed wiring board at high productivity and low cost.

(2) In laminating the multi-layer substrate of this invention with a base substrate (other wiring board substrate), it is possible to easily realize such characteristics as low heat conductivity, low coefficient of thermal expansion and low dielectric constant by changing the material of the prepreg or the laminate including metal core.

(3) By laminating the single-side copper-foiled heat-resistant resin-made multi-layer substrates on both sides of a base substrate simultaneously, it is possible to easily obtain a wiring board structure capable of mounting LSI chips on both sides thereof.

(4) Since the surface gold pad (surface wiring pattern) is embedded in the laminate, the surface pad has good adhesion to the laminate and is also alleviated in the problems of rise-up of the pad, its separation, etc., to be caused by the mechanical forces at the time of wire bonding in comparison with the conventional structure in which the pad protrudes above the substrate.

(5) Since lamination is conducted after thin-film wiring has been formed, inspection of the substrate before lamination is possible and the yield is enhanced in production thereof.

What is claimed is:

1. A process for producing a high-density wiring board comprising the following steps:
    (a) forming a metal layer on a tentative substrate;
    (b) forming a predetermined resist pattern on said metal layer;
    (c) forming on said metal layer a surface wiring pattern of a metal which is resistant to the etching solution used for etching said metal layer;
    (d) removing the resist pattern;
    (e) forming on said surface wiring pattern heat-resistant resin layers and thin-film wiring patterns formed by a thin film forming method under vacuum, said resin layers and thin-film wiring patterns being built up successively in a desired number of layers to make a multilayered substrate;
    (f) after forming the multilayered substrate, integrally laminating another wiring board substrate (base structure), on which the necessary wiring pattern has already been formed, on the heat-resistant resin layer side of said multilayered substrate after said tentative substrate has been separated, or integrally laminating said another wiring board substrate on the heat-resistant resin layer side of said multilayered substrate and then separating said tentative substrate, the another wiring board substrate being an insulating substrate; and
    (g) forming through-holes through the another wiring board substrate and the multilayered substrate, forming a conductive metal on the inside of the through-holes, and removing the metal layer, so as to form a circuit of the wiring board.

2. The process according to claim 1, wherein the another wiring board substrate is a single-side copper-clad laminate having the necessary wiring pattern already formed on one side thereof.

3. The process according to claim 1, wherein the conductive metal formed on the inside of the through-holes is copper, and the forming of the conductive metal on the inside of the through-holes is performed by plating.

4. The process according to claim 3, wherein the through-holes are formed by drilling.

5. the process according to claim 1, wherein the another wiring board substrate is made of plastic organic material.

6. The process according to claim 1, wherein the another wiring board substrate is made of an insulating laminate on which the necessary wiring pattern has already been formed.

7. The process according to claim 6, wherein the insulating laminate is an organic insulating laminate.

8. The process according to claim 7, wherein the organic insulating laminate includes prepregs.

9. The process according to claim 8, wherein the prepregs are prepregs prepared by impregnating glass cloth, Kepler's cloth or quartz cloth with a polyester resin, epoxy resin or polyimide resin and curing to a B-stage.

10. The process according to claim 6, wherein the insulating laminate is an inorganic insulating laminate.

11. The process according to claim 1, wherein gas release in the another wiring board substrate occurs in treatment of the another wiring board substrate under vacuum, and wherein, because the another wiring board and the multi-layered substrate are integrally laminated after forming the multilayered substrate, gas release in the another wiring board substrate due to treatment during the thin film forming method under vacuum is avoided.

12. The process according to claim 1, wherein the thin film forming method under vacuum is an electron beam deposition or a sputtering method.

13. The process according to claim 1, wherein the heat-resistant resin layers are formed of polyimide resin.

14. The process according to claim 1, wherein the metal layer, predetermined resist pattern, surface wiring pattern and heat-resistant resin layers and thin-film wiring patterns are formed on both sides of the tentative substrate simultaneously.

15. The process according to claim 1, wherein the another wiring board substrate and the multilayered substrate are integrally joined by placing a prepreg between the another wiring board substrate and the multilayered substrate, and then pressing while heating to obtain an integral laminated structure.

16. The process according to claim 1, wherein two multilayered substrates are formed, by the steps (a)-(e), and the another wiring board substrate has the two multilayered substrates integrally laminated thereto, respectively on opposed sides of the another wiring board substrate.

17. The process according to claim 1, wherein the surface wiring pattern and heat-resistant resin layers are formed such that the surface wiring pattern is embedded as part of the multilayered substrate.

* * * * *